NONRECTIFYING LAMINATED OHMIC CONTACT FOR SEMICONDUCTORS CONSISTING OF CHROMIUM AND 80% NICKEL

Filed April 18, 1966

INVENTOR
HIROSHI NAGATSU
YOSHIAKI MIMURA
HIDEO IZUMI
YOSHIHIRO MASUDA

BY McGlew and Toren
ATTORNEYS

INVENTOR
HIROSHI NAGATSU
YOSHIAKI MIMURA
HIDEO IZUMI
YOSHIHIRO MASUDA

BY

McGlew and Toren
ATTORNEYS

United States Patent Office 3,436,614
Patented Apr. 1, 1969

3,436,614

NONRECTIFYING LAMINATED OHMIC CONTACT FOR SEMICONDUCTORS CONSISTING OF CHROMIUM AND 80% NICKEL

Hiroshi Nagatsu, Yoshiaki Mimura, Hideo Izumi, and Yoshihiro Masuda, Tokyo, Japan; said Nagatsu and said Mimura assignors of one-half to Nippon Telegraph and Telephone Public Corporation, Tokyo, Japan, and said Izumi and said Masuda assignors of one-half to Shiba Electric Company Limited, Tokyo, Japan Filed Apr. 18, 1966, Ser. No. 543,333
Claims priority, application Japan, Apr. 20, 1965, 40/22,980
Int. Cl. H01l 1/14, 3/00, 11/02
U.S. Cl. 317—234 2 Claims

ABSTRACT OF THE DISCLOSURE

A non-rectifying laminated ohmic contact for semiconductors, designed to have a lead soldered thereto, comprises a first thin metal layer vapor deposited in direct surface contact with the semiconductor and comprising an alloy consisting of nickel and chromium and containing substantially 80% nickel, and a second thin metal layer vapor deposited on the first layer and comprising a metal selected from the group consisting of gold, silver, copper, zinc, tin and lead.

This invention relates to ohmic contacts with semiconductors and methods of applying the same.

It is a problem, very important to the manufacture of such semiconductor devices as transistors and diodes, to make a terminal for taking out an electric current by ohmically or nonrectifyingly connecting a metal with such semiconductor as, for example, germanium or silicon. Various methods have been already attempted to solve it. For example, a method wherein the surface of a semiconductor is first sandblasted, whereby the life time of the surface may be reduced, and is then plated with such metal as nickel, or a method wherein, in the case of a small semiconductor device of a semiconductor crystal high in the impurity concentration, a gold wire is welded by a thermocompression bonding method or an aluminum wire is welded by utilizing supersonic waves, have been extensively practiced.

But it is usual that the terminal made by such method is accompanied with such defects that the rectifying property will remain, that the strain by welding will remain and that the mechanical strength will be low.

An object of the present invention is to provide a method of obtaining, on a semiconductor crystal, a favorable contact which is mechanically tough, leaves no strain and has no rectifying property.

Another object of the present invention is to provide, on a semiconductor crystal, a contact which is mechanically tough, leaves no strain and has no rectifying property.

In the accompanying drawings.

Examples of the present invention shall be explained in detail in the following.

EXAMPLE 1

First of all, an ohmic contact provided on each of the opposite surfaces of a diffusion type silicon transistor or diode shall be described.

Figure 1:
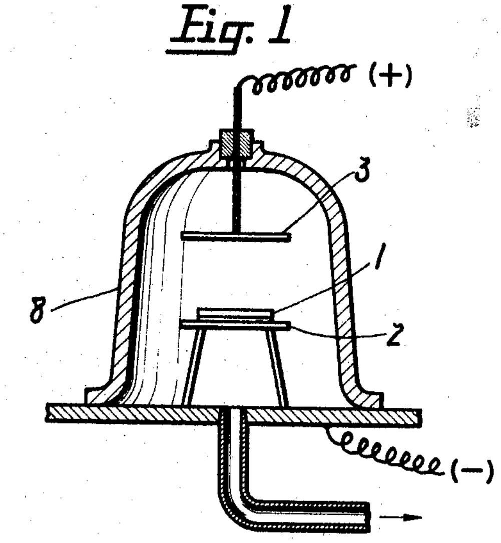
FIG. 1 is a view illustrating a glow discharge device to be used to clean the surfaces of semiconductors.

As impurities have been diffused on the opposite surfaces of a silicon wafer to be used in such case, the impurity concentration near the surface is high. The wafer 1, as washed with hydrofluoric acid to remove the oxidized film formed at the time of diffusion and to clean the surfaces, is placed, as an electrode on a supporting stand 2 so as to be opposed to a counter electrode 3 in a glow discharge device such as shown in FIG. 1. In such case, the distance between the counter electrode and the supporting stand is not specifically specified but is usually about 3 to 10 cm. In such state, when a voltage is applied to make a glow discharge while the gas pressure in a bell jar 8 of the device is reduced to a selected pressure of about $10^{-2}$ mm. Hg, the surfaces of the silicon wafer will be cleaned and will be covered again with a very thin oxidized film.

Figure 2:
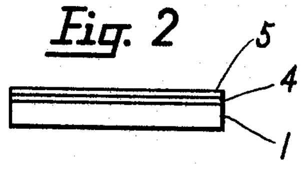
FIG. 2 is an elevation view of a contact according to the present invention.

Then said silicon wafer is taken out, is positioned in a vacuum-evaporating device provided with an evaporating source, is subjected to a high vacuum and is subjected to vacuum-evaporation in the following order. That is to say, first of all, a nichrome of 80% Ni and 20% Cr is deposited by evaporation on the above mentioned silicon wafer so as to be 500 to 600 A. thick and then pure copper is deposited by vacuum-evaporation thereon so as to be 1,000 to 10,000 A. thick. Therefore, the first evaporation-deposited layer 4 of the nichrome and the second evaporation-deposited layer 5 of the copper will be securely deposited in contact with each other on the silicon wafer, as in FIG. 2.

Soldering is so easily possible on the surface of the copper thus deposited by evaporation on the silicon wafer as on an ordinary copper plate that, when a required lead wire is soldered to the surface, a very tough mechanical contact will be obtained between said lead wire and silicon wafer and the mechanical tensile strength of said contact will reach 4 kg./mm.$^2$.

Figure 3:
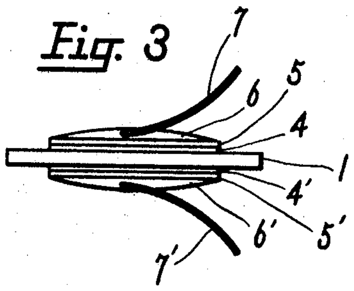
FIG. 3 is an elevation of a test piece to be used to measure the electric characteristics of the contact according to the present invention.
Figure 4:
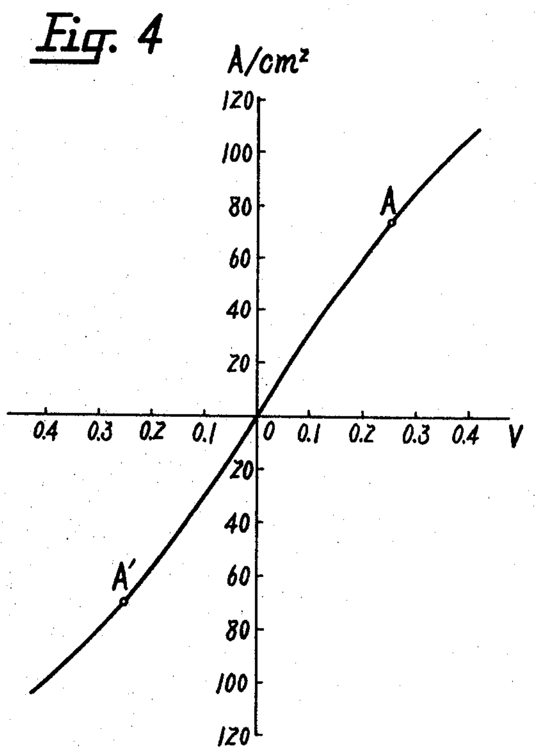
FIG. 4 is a voltage-current characteristics diagram of the test piece shown in FIG. 3.
Figure 5:
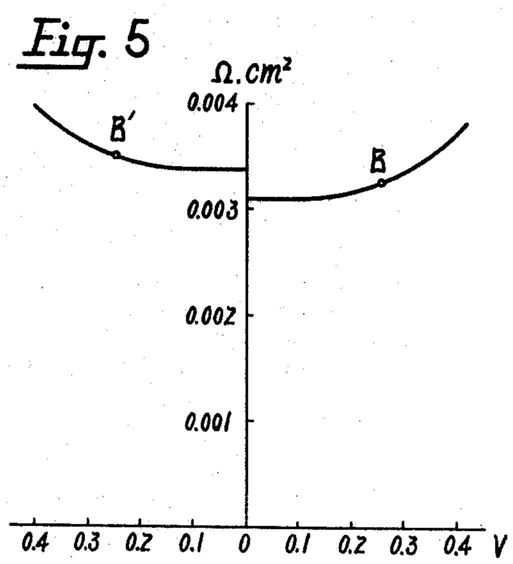
FIG. 5 is a voltage-resistance characteristics diagram of the test piece shown in FIG. 3.

The electric characteristics of such contact shall be described now. That is to say, there shall be explained voltage-current characteristics between both copper wires where a contact of the same formation as in the above mentioned example is made on each of the opposite surfaces of a thin wafer of a single crystal of silicon of a low specific electric resistance of about 0.02 Ω-cm., a solder is deposited completely over both surfaces and a lead wire of copper is fixed to each of said surfaces. FIG. 3 is an elevation of a test piece showing the above explained formation. In FIG. 3, 1 is a single crystal of silicon. 4 and 4' are evaporation-deposited layers of a nichrome. 5 and 5' are evaporation-deposited layers of copper. 6 and 6' are layers of solder. 7 and 7' are copper wires forming current leads. The voltage-current characteristics of this embodiment of such formation are as shown in FIG. 4. The relation of the voltage and resistance values are as shown in FIG. 5. According to FIG. 5, the resistance value of this contact appears to vary more or less with the voltage. But the range to be actually used is a range of voltage smaller than A–A' in FIG. 4 or B–B' in FIG. 5. Therefore, the variation of the resistance value is very little, the difference of the resistance value with the current direction is not a trouble at all in practice and thus this contact can be said to be of very good ohmic characteristics. Further, as evident also from FIG. 3, the resistance value in FIG. 5 is a sum of the resistance values of two contacts. Therefore, it will be clear that the resistance value of the present invention is half this sum. Further, for a single crystal of silicon of a specific resistance smaller than in the above, the resistance value of the contact will be smaller and the linearity of the voltage-current characteristics will be better. Thus, the contact of this example is high in the mechanical strength, is not apt to be broken by residual strains and is high also in electric characteristics. Therefore, it has advantages that it is very well adapted to be used as an ohmic contact for such semiconductor devices as transistors and diodes, and can be formed simply and cheaply.

The gas pressure for the glow discharge in the above mentioned example is not limited to be $10^{-2}$ mm. Hg but may be higher or lower than this value. The gas to be used may be not only air but also oxygen, nitrogen, argon, helium, neon or any other gas. Further, there will be no substantial trouble even if the thickness of the nichrome deposited by vacuum-evaporation is in a range of 50 to 800 A. The composition of the contact may be not only of the above mentioned nichrome but may also be of pure nickel or a nichrome of 60% Ni and 40% Cr or any other intermediate composition. Its tensile strength will exceed 2 kg./mm.$^2$. even in the case of 60% Ni and 40% Cr. Further, when the thickness of the second evaporation-deposited layer of copper is also more than 100 A., it may be a thickness to provide electroconductivity and to obtain the same action as a soldering base, and need not be always limited to the thickness in the above mentioned example.

EXAMPLE 2

The ohmic contact according to the present invention can be embodied also by such combination as in the following. That is to say, the treatment is the same as is described in Example 1 until the process of glow-discharge-treating the silicon wafer. Then, while the silicon wafer is kept heated at about 200° C. with a heater, in an evaporating device kept at a high vacuum, metallic manganese is first deposited by vacuum-evaporation as a first layer on a silcion plate and then copper is deposited by vacuum-evaporation as a second layer on the manganese. In such case, the thicknesses of both evaporation-deposited layers are the same as in Example 1.

As the outer surface of the thus obtained ohmic contact between the semiconductor and metal is of copper, a lead wire can be easily soldered as in Example 1. In case a lead wire is soldered to the ohmic contact according to Example 2, the tensile strength will reach 2.4 kg./mm.$^2$ and the electric characteristics will be the same as in Example 1.

EXAMPLE 3

The device to be used and the preparation of the silicon plate are exactly the same as in the above mentioned two examples. During the vacuum evaporation, the silicon wafer is heated at 150° C., and manganese is deposited by vacuum-evaporation as a first layer and a tin-lead alloy having a eutectic ratio of 62% tin and 38% lead is also deposited by vacuum-evaporation as a second layer. The tensile strength of the contact, thus made according to the present invention, with a terminal will reach 2.1 kg./mm.$^2$ and the electric characteristics will be the same as in the above mentioned examples. In such case, the thicknesses of the evaporated metal films are the same as in Examples 1 and 2.

EXAMPLE 4

In the same method as in Examples 2 and 3, the temperature of the ground silicon at the time of the deposition by vacuum-evaporation ranges from room temperature to 150° C. The evaporation-deposited metal is a nichrome of 80% Ni and 20% Cr as the first layer, and a eutectic alloy of tin and lead in the second layer. When the thicknesses of these films are made the same as in the above mentioned examples, the tensile strength, between a terminal wire soldered on the metal film and the silicon plate, will reach 2.2 kg./mm.$^2$ and the contact will show electric characteristics favorable as an ohmic contact. In such case, the solder in the second layer may be, for example, an alloy of 7% tin and 93% lead, an alloy of 1% tin, 1.5% silver and 97.5% lead or a solder of any composition. Further, the second layer may be a layer made by expanding the metal with a trowel by using a flux in air or by heating it in a furnace instead of evaporating it. In the same manner as in Example 1, the composition of the first layer may be varied.

EXAMPLE 5

The device to be used and the preparation of the silicon plate are made the same as in the above mentioned Examples 1 to 4. In depositing metals by evaporation, the temperature of the ground silicon crystal plate and the kinds of the first evaporation-deposited metal layer (intermediate layer) and the second evaporation-deposited metal layer (conductive electrode layer) are varied. The tensile strength of the ohmic contact thus made according to the present invention is high. They are as collectively shown in Table 1.

TABLE 1

| Kind of the first layer metal | Kind of the second layer metal | Temperature of silicon during the deposition by evaporation, ° C. | Tensile strength, kg./mm.$^2$ |
|---|---|---|---|
| Nickel | Copper | 200 | 1.9 |
| Titanium | do | 200 | 1.5 |
| Vanadium | do | 200 | 2.0 |
| Cobalt | do | 200 | 2.5 |
| Iron | do | 200 | 2.3 |

It is also the same as in the other examples that the electric characteristics of the ohmic contact made by the combination of these electrode metals are favorable, with a low ohmic resistance.

EXAMPLE 6

In each of the above examples, silicon is used for the semi-conductor. Germanium can be used in the same manner. That is to say, one surface of a thin plate of a single crystal of germanium, having the specific electric resistance of the surface reduced by applying diffusion, is treated in the same manner as in Example 1 until the discharge treatment. The plate is then placed in a vacuum-evaporating device. A nichrome of 80% Ni and 20% Cr is first deposited by evaporation as a first layer on the plate so as to be 500 to 600 A. thick and copper is then deposited by evaporation as a second layer on the first layer so as to be 1,000 to 10,000 A. thick. The contact thus made according to the present invention has a tensile strength higher than 2.2 kg./mm.$^2$ between the plate and a current lead wire soldered on the copper. The electric characteristics of this contact are also ohmic and are low in resistance as in Example 1. Further, even if the thickness of the evaporation-deposited layer is varied, the contact according to the present invention will be obtained as in Example 1.

Even if the following metals are used for the evaporation-deposited metals to be used for the ohmic contacts according to the present invention, the same favorable contacts will be obtained. That is to say, for the first layer can be used not only the nichrome but also such metals as titanium, vanadium, manganese, iron, cobalt, nickel and tungsten or alloys of them. For the second layer can be used such metals as gold, silver, copper, tin, zinc and lead or alloys of them. In depositing tungsten by evaporation, it may be heated with electron beams.

The semiconductor to be used in the present invention is not limited to a wafer to silicon or germanium made specifically high in the impurity concentration on the surface by diffusing impurities as in the above examples. The ohmic contact can be obtained with a crystal of silicon or germanium of any impurity concentration and Por N conduction type used extensively, and also in any of Examples 1 to 6. Further, the ohmic contact can be obtained with any of not only silicon and germanium but also such compounds in Groups III–V in the Periodic Table as GaAs, InSb and GaP. The thickness of the evaporation-deposited, metal layer can be varied widely in any of the examples, as in Example 1.

Even if the step of the pretreatment with a glow discharge mentioned in Example 1 is omitted in any of the examples, there will be no substantial difference except a very slight variation in the characteristics of the contact. Therefore, the pretreatment may be omitted in some cases.

What is claimed is:

1. A non-rectifying laminated ohmic contact for semiconductors, designed to have a lead soldered thereto, said contact comprising, in combination, a first thin metal layer vapor deposited in direct surface contact with the semiconductor and comprising an alloy consisting of nickel and chromium containing substantially 80% nickel; and a second thin metal layer vapor deposited on said first layer and comprising metal selected from the group consisting of gold, silver, copper, zinc, tin and lead.

2. A non-rectifying laminated ohmic contact for semiconductors, as claimed in claim 1, in which said second thin metal layer is an alloy comprising metals selected from the group consisting of gold, silver, copper, zinc, tin and lead.

References Cited

UNITED STATES PATENTS

| | | | |
|---|---|---|---|
| 3,287,610 | 11/1966 | Reber | 317—234 |
| 3,268,309 | 8/1966 | Frank | 29—195 |
| 3,325,702 | 6/1967 | Cuningham | 317—234 |
| 3,196,329 | 7/1965 | Cook | 317—234 |
| 2,863,105 | 12/1958 | Ross | 317—234 |
| 3,258,898 | 7/1966 | Garibotti | 29—155.5 |
| 2,973,466 | 2/1961 | Atalla | 317—240 |
| 3,310,711 | 3/1967 | Hangstefer | 317—101 |

JOHN W. HUCKERT, *Primary Examiner.*

M. EDLOW, *Assistant Examiner.*

U.S. Cl. X.R.

317—235